(12) United States Patent
Li et al.

(10) Patent No.: US 10,998,424 B2
(45) Date of Patent: May 4, 2021

(54) VERTICAL METAL-AIR TRANSISTOR

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Ruilong Xie, Niskayuna, NY (US); Chanro Park, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/571,997

(22) Filed: Sep. 16, 2019

(65) Prior Publication Data
US 2021/0083075 A1  Mar. 18, 2021

(51) Int. Cl.
*H01L 29/51* (2006.01)
*H01L 29/66* (2006.01)
*H01L 29/78* (2006.01)
*H01L 21/768* (2006.01)
*H01L 29/43* (2006.01)
(Continued)

(52) U.S. Cl.
CPC .. *H01L 29/66666* (2013.01); *H01L 21/02205* (2013.01); *H01L 21/76879* (2013.01); *H01L 29/402* (2013.01); *H01L 29/43* (2013.01); *H01L 29/66015* (2013.01); *H01L 29/7827* (2013.01)

(58) Field of Classification Search
CPC ........... H01L 21/7682; H01L 29/66795; H01L 29/785; H01L 21/76897; H01L 29/6653; H01L 21/764; H01L 29/0649; H01L 29/42392; H01L 29/78696; H01L 29/4991; H01L 29/66666; H01L 29/7827; H01L 29/78642
See application file for complete search history.

(56) References Cited

U.S. PATENT DOCUMENTS

| | | |
|---|---|---|
| 4,721,885 A | 1/1988 | Brodie |
| 5,012,153 A | 4/1991 | Atkinson et al. |
| 7,566,945 B2 | 7/2009 | Choi et al. |

(Continued)

FOREIGN PATENT DOCUMENTS

CN   108461496 A   8/2018

OTHER PUBLICATIONS

Rollins et al., "Nanotubes for Electronics", Scientific American, Dec. 2000, pp. 62-69.

(Continued)

*Primary Examiner* — Jaehwan Oh
(74) *Attorney, Agent, or Firm* — Tutunjian & Bitetto, P.C.; Douglas Pearson

(57) ABSTRACT

A method of forming a vertical metal-air transistor device is provided. The method includes forming a precursor stack with a stack template on the precursor stack on a substrate. The method further includes forming a bottom spacer on the substrate around the precursor stack, and depositing a liner casing on the precursor stack. The method further includes depositing a conductive gate layer on the bottom spacer and liner casing. The method further includes reducing the size of the stack template to form a template post on the precursor stack, and forming a stack cap on the template post and precursor stack.

14 Claims, 11 Drawing Sheets

(51) Int. Cl.
   *H01L 29/40* (2006.01)
   *H01L 21/02* (2006.01)

(56) References Cited

U.S. PATENT DOCUMENTS

| | | | |
|---|---|---|---|
| 7,772,079 | B2 | 8/2010 | Meng et al. |
| 8,053,846 | B2 | 11/2011 | Cha et al. |
| 9,368,572 | B1* | 6/2016 | Cheng ................ H01L 27/1248 |
| 9,502,659 | B2 | 11/2016 | Bourgin et al. |
| 9,570,612 | B2 | 2/2017 | Ohtou et al. |
| 9,793,395 | B1 | 10/2017 | Liu et al. |
| 2012/0126302 | A1* | 5/2012 | Noda ................ H01L 21/7682 |
| | | | 257/315 |
| 2014/0299989 | A1* | 10/2014 | Lim ........................ H01L 23/48 |
| | | | 257/751 |
| 2015/0014759 | A1* | 1/2015 | Lee ................... H01L 23/53266 |
| | | | 257/306 |
| 2017/0269481 | A1* | 9/2017 | Borodovsky ......... G03F 7/2037 |
| 2019/0334008 | A1* | 10/2019 | Chen ................ H01L 29/66545 |
| 2020/0273753 | A1* | 8/2020 | Loubet ............... H01L 29/0673 |

OTHER PUBLICATIONS

Nirantar et al., "Metal-Air Transistors: Semiconductor-free field-emission air-channel nanoelectronics", NANO Letters, Nov. 2018, pp. 1-23.

Xu et al., "Graphene-Based Nanoscale Vacuum Channel Transistor", Nanoscale Research Letters, Oct. 2018, 8 pages.

* cited by examiner

VERTICAL METAL-AIR TRANSISTOR

BACKGROUND

The present invention generally relates to metal-air-gap transistor devices, and more particularly to vertically aligned metal-air-gap transistor devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate).

SUMMARY

In accordance with an embodiment of the present invention, a method of forming a vertical metal-air transistor device is provided. The method includes forming a precursor stack with a stack template on the precursor stack on a substrate. The method further includes forming a bottom spacer on the substrate around the precursor stack, and depositing a liner casing on the precursor stack. The method further includes depositing a conductive gate layer on the bottom spacer and liner casing. The method further includes reducing the size of the stack template to form a template post on the precursor stack, and forming a stack cap on the template post and precursor stack.

In accordance with another embodiment of the present invention, a method of forming a vertical metal-air transistor device is provided. The method includes forming a lower electrode layer on a substrate, forming a graphene layer on the lower electrode layer, and forming an upper electrode layer on the graphene layer. The method further includes forming a stack template on the upper electrode layer. The method further includes removing portions of the upper electrode layer, graphene layer, and lower electrode layer to form a precursor stack on a lower electrode slab, wherein the precursor stack includes an upper electrode column, a lower electrode column on the lower electrode slab, and a graphene plate between the upper electrode column and lower electrode column. The method further includes forming a bottom spacer on the lower electrode slab around the precursor stack, and depositing a liner casing on the precursor stack and bottom spacer. The method further includes depositing a conductive gate layer on the liner casing, and removing a portion of the liner casing on the stack template. The method further includes reducing the size of the stack template to form a template post on the precursor stack, and forming a stack cap on the template post and precursor stack.

In accordance with yet another embodiment of the present invention, a vertical metal-air transistor device is provided. The vertical metal-air transistor device includes a lower electrode annulus on a substrate, an upper electrode annulus, and an interstice between the upper electrode annulus and lower electrode annulus.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a method of forming a metal-air gap transistor device having accurately controlled gap distances between the electrodes forming the transistor device. Use of graphene to define the spacing between adjacent electrodes can provide control within a monolayer thickness. Removal of a predetermined number of monolayers of the sacrificial graphene provides a precisely controlled gap distance between the facing surfaces of ring-shaped electrodes.

Embodiments of the present invention provide a vertically aligned metal-air gap transistor device having a reduced device footprint compared to horizontal metal-air gap transistor devices and fin field effect transistor devices. Use of an annular shape for the device electrodes allows greater surface and emission area to increase tunneling current for a given voltage. Wrap-around metal gates provide uniform electrical fields to control the current at the electrode gap.

Exemplary applications/uses to which the present invention can be applied include, but are not limited to: digital logic circuits (e.g., NAND gates, etc.), memory devices, and analog circuits.

It is to be understood that aspects of the present invention will be described in terms of a given illustrative architecture; however, other architectures, structures, substrate materials and process features and steps can be varied within the scope of aspects of the present invention.

Figure 1:
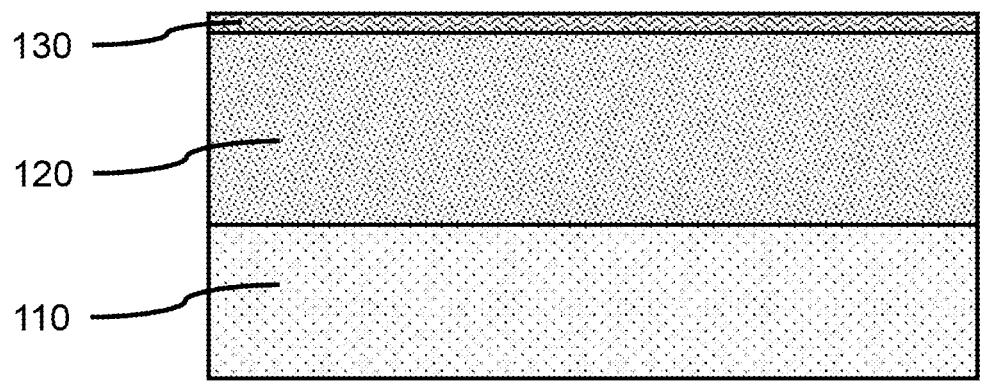
FIG. 1 is a cross-sectional side view showing a lower electrode layer on a substrate and a graphene layer on the lower electrode layer, in accordance with an embodiment of the present invention.

Referring now to the drawings in which like numerals represent the same or similar elements and initially to FIG. 1, a cross-sectional side view of a lower electrode layer on a substrate and a graphene layer on the lower electrode layer, in accordance with an embodiment of the present invention.

In one or more embodiments, a substrate 110 can be a metal, a semiconductor, or an insulator material, where the substrate 110 can provide a support for a subsequently formed electrode layer. In various embodiments, the substrate can be a ceramic insulator material, for example, silicon nitride (SiN), aluminum oxide (AlO), zirconium oxide (ZrO), aluminum nitride (AlN), and combinations thereof. In various embodiments, a metal substrate can be titanium (Ti), hafnium (Hf), tantalum (Ta), niobium (Nb), nickel (Ni), cobalt (Co), copper (Cu), tungsten (W), molybdenum (Mo), titanium carbide (TiC), titanium aluminum carbide (TiAlC), tantalum carbide (TaC), tantalum nitride (TaN), tantalum silicon nitride (TaSiN), tungsten nitride (WN), molybdenum nitride (MoN), niobium nitride (NbN), and combination thereof. In various embodiments, a semiconductor substrate can be silicon (Si), silicon-germanium (SiGe), germanium, (Ge), silicon carbide (SiC), gallium arsenide (GaAs), gallium nitride (GaN), silicon-germanium-carbon (SiGeC), Si alloys, Ge alloys, indium arsenide (InAs), indium phosphide (InP), and combination thereof. Any substrate with reasonable stiffness/strength can be used.

In one or more embodiments, a lower electrode layer 120 can be formed on a substrate 110, where the lower electrode layer 120 can be formed by a blanket deposition that covers the exposed surface(s) of the substrate 110. The lower electrode layer 120 can be formed by a blanket deposition, including, but not limited to, chemical vapor deposition (CVD), plasma enhanced chemical vapor deposition (PECVD), ultrahigh vacuum chemical vapor deposition (UHVCVD), rapid thermal chemical vapor deposition (RT-CVD), low-pressure chemical vapor deposition (LPCVD), limited reaction processing CVD (LRPCVD), atomic layer deposition (ALD), chemical solution deposition, molecular beam epitaxy (MBE), metal-organic chemical vapor deposition (MOCVD), physical vapor deposition (e.g., evaporation, sputter deposition), or a combination thereof.

In various embodiments, the lower electrode layer 120 can have a thickness in a range of about 20 nanometers (nm) to about 100 nm, or about 30 nm to about 50 nm, although other thicknesses are also contemplated.

In one or more embodiments, the lower electrode layer 120 can be a metal, for example, tungsten (W), cobalt (Co), tantalum (Ta), niobium (Nb), platinum (Pt), ruthenium (Ru), palladium (Pd), or gold (Au), a metal compound, for example, lanthanum hexaboride (LaB6), metal alloys, for example, ceriated tungsten (W:Ce), and combinations thereof.

In one or more embodiments, a graphene layer 130 can be formed on the exposed top surface of the lower electrode layer 120 opposite from the interface between the lower electrode layer 120 and the substrate 110. In various embodiments, the graphene layer 130 can be composed of one or more graphene monolayers, where a graphene monolayer can have a thickness of approximately 0.345 nm. In various embodiments, the graphene layer 130 can have a thickness of 3 monolayers to 8 monolayers, or 4 monolayers to 6 monolayers. The graphene layer 130 can have a minimum thickness of about 1 nanometer.

In one or more embodiments, the graphene layer 130 can be formed on the surface of the lower electrode layer 120, where the lower electrode layer 120 is a suitable material, where the graphene layer can be formed by chemical vapor deposition. The graphene layers can be obtained on polycrystalline metal substrates with high carbon solubility.

Figure 2:
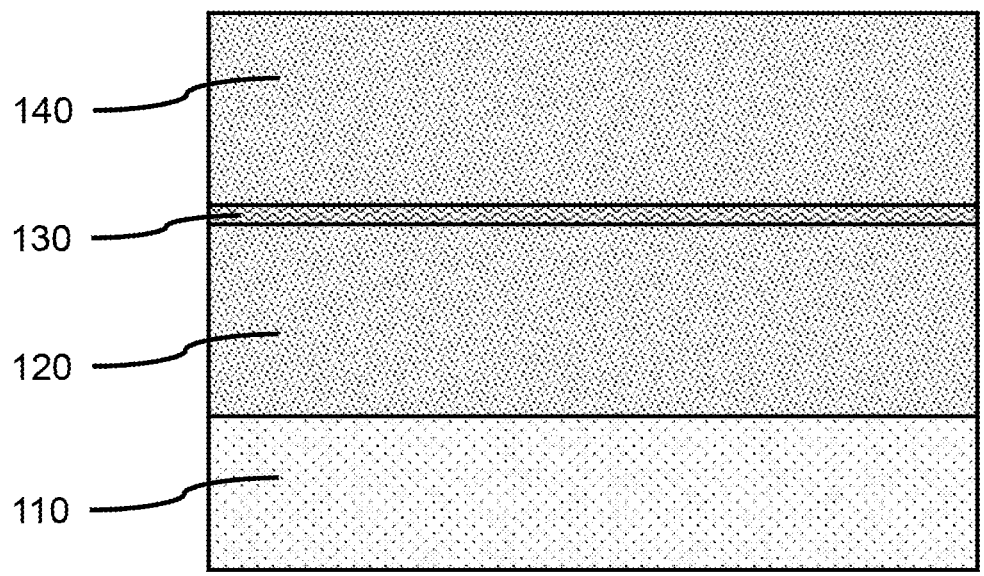
FIG. 2 is a cross-sectional side view showing an upper electrode layer formed on the graphene layer, in accordance with an embodiment of the present invention.

FIG. 2 is a cross-sectional side view showing an upper electrode layer formed on the graphene layer, in accordance with an embodiment of the present invention.

In one or more embodiments, an upper electrode layer 140 can be formed on the graphene layer 130, where the upper electrode layer 140 can be formed by a blanket deposition (e.g., CVD, PECVD, MOCVD, PVD, etc.).

In one or more embodiments, the upper electrode layer 140 can be a metal, for example, tungsten (W), cobalt (Co), tantalum (Ta), niobium (Nb), platinum (Pt), ruthenium (Ru), palladium (Pd), or gold (Au), and combinations thereof; a metal compound, for example, lanthanum hexaboride (LaB6), metal alloys, for example, ceriated tungsten (W:Ce), and combinations thereof. The upper electrode layer 140 can be a different metal from the lower electrode layer 120.

In various embodiments, the upper electrode layer 140 can have a thickness in a range of about 20 nanometers (nm) to about 100 nm, or about 30 nm to about 50 nm, although other thicknesses are also contemplated.

Figure 3:
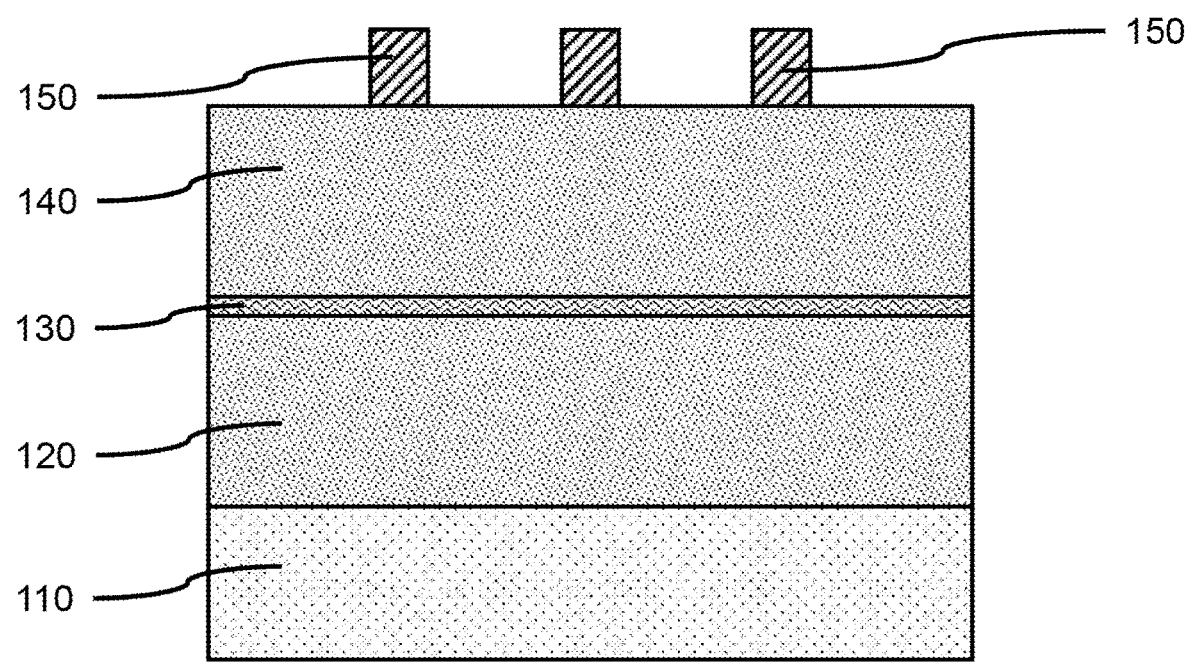
FIG. 3 is a cross-sectional side view showing a plurality of stack templates formed on the upper electrode layer, in accordance with an embodiment of the present invention.

FIG. 3 is a cross-sectional side view showing a plurality of stack templates formed on the upper electrode layer, in accordance with an embodiment of the present invention.

In one or more embodiments, a template layer can be formed on the exposed top surface of the upper electrode layer 140, where the template layer can be a hardmask material layer. The template layer can be formed by a blanket deposition, and patterned using lithographic processes and etching to form one or more stack templates 150 on the upper electrode layer 140.

In various embodiments, the template layer and stack templates can be silicon oxide (SiO), silicon nitride (SiN), silicon boronitride (SiBN), silicon carbonitride (SiCN), silicon boro carbonitride (SiBCN), or a combination thereof (e.g., multilayers).

In various embodiments, the stack templates 150 can be circular, although other shapes are also contemplated (e.g., square, rectangular, etc.). In various embodiments, the stack templates 150 can have a diameter in a range of about 20 nm to about 50 nm, or about 20 nm to about 40 nm, or about 20 nm to about 30 nm, although other diameters and sizes are also contemplated.

Figure 4:
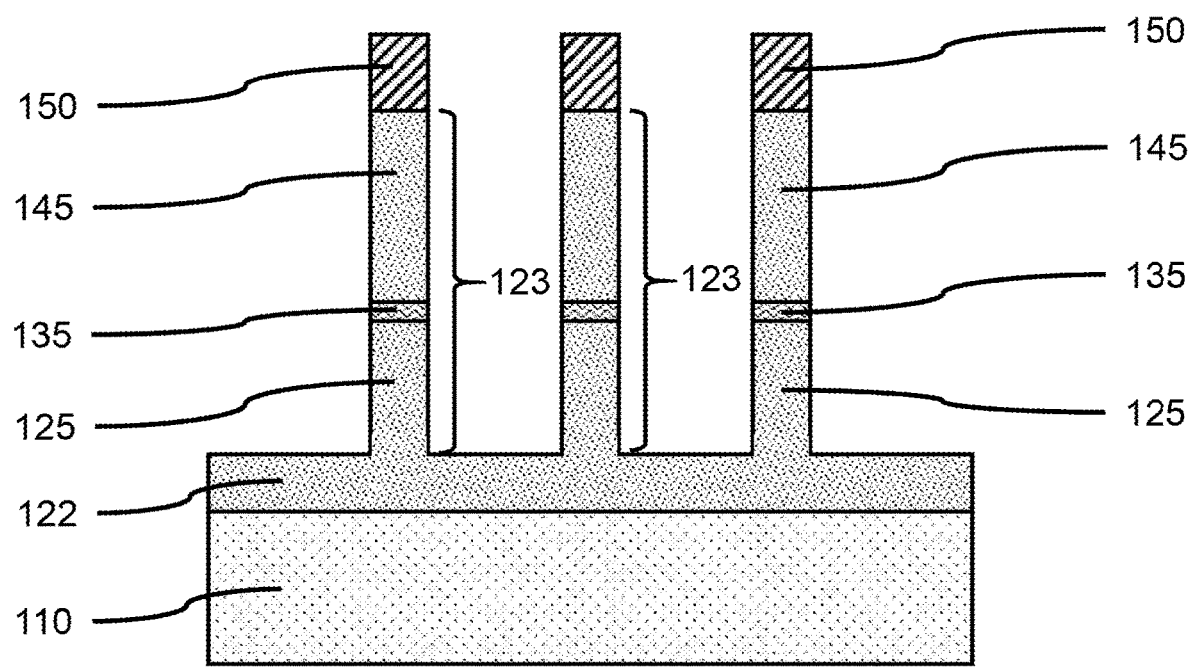
FIG. 4 is a cross-sectional side view showing the upper electrode layer, graphene layer, and lower electrode layer formed into a plurality of precursor stack using the stack templates, in accordance with an embodiment of the present invention.

FIG. 4 is a cross-sectional side view showing the upper electrode layer, graphene layer, and lower electrode layer formed into a plurality of precursor stack using the stack templates, in accordance with an embodiment of the present invention.

In one or more embodiments, portions of the upper electrode layer 140, graphene layer 130, and lower electrode layer 120 between the stack templates 150 can be removed, where the portions of the upper electrode layer 140 and lower electrode layer 120, can be removed using a selective directional etch, for example, a reactive ion etch (RIE). Removal of the portions of the graphene layer 130 can be done using an oxygen plasma etch. Removal of the portions of the upper electrode layer 140 exposed between the stack templates 150 to the graphene layer 130 can form an upper electrode column 145. Removal of the portions of the graphene layer 130 exposed by the removal of the upper electrode layer 140 can form a graphene plate 135. Removal of the portions of the lower electrode layer 130 exposed by removal of the portions of the graphene layer 130 can form a lower electrode column 125. A portion of the lower electrode layer 130 can remain unetched on the substrate 110, as a lower electrode slab 122, where the height of the lower electrode column 125 can be less than the height of the upper electrode column 145. The graphene plate 135 can be between the top surface of the lower electrode column 125 and the bottom surface of the upper electrode column 145. The lower electrode column 125 on the lower electrode slab 122, the graphene plate 135, and the upper electrode column 145 can form a precursor stack 123, where the stack template 150 is on the precursor stack 123. The lower electrode slab 122 can form an electrical connection to the lower electrode column 125 and precursor stack 123.

In various embodiments, the lower electrode column 125 can have a height from the top surface of the lower electrode slab 122 in a range of about 10 nm to about 100 nm, or about 20 nm to about 70 nm, or about 30 nm to about 40 nm, although other heights are also contemplated.

Figure 5:
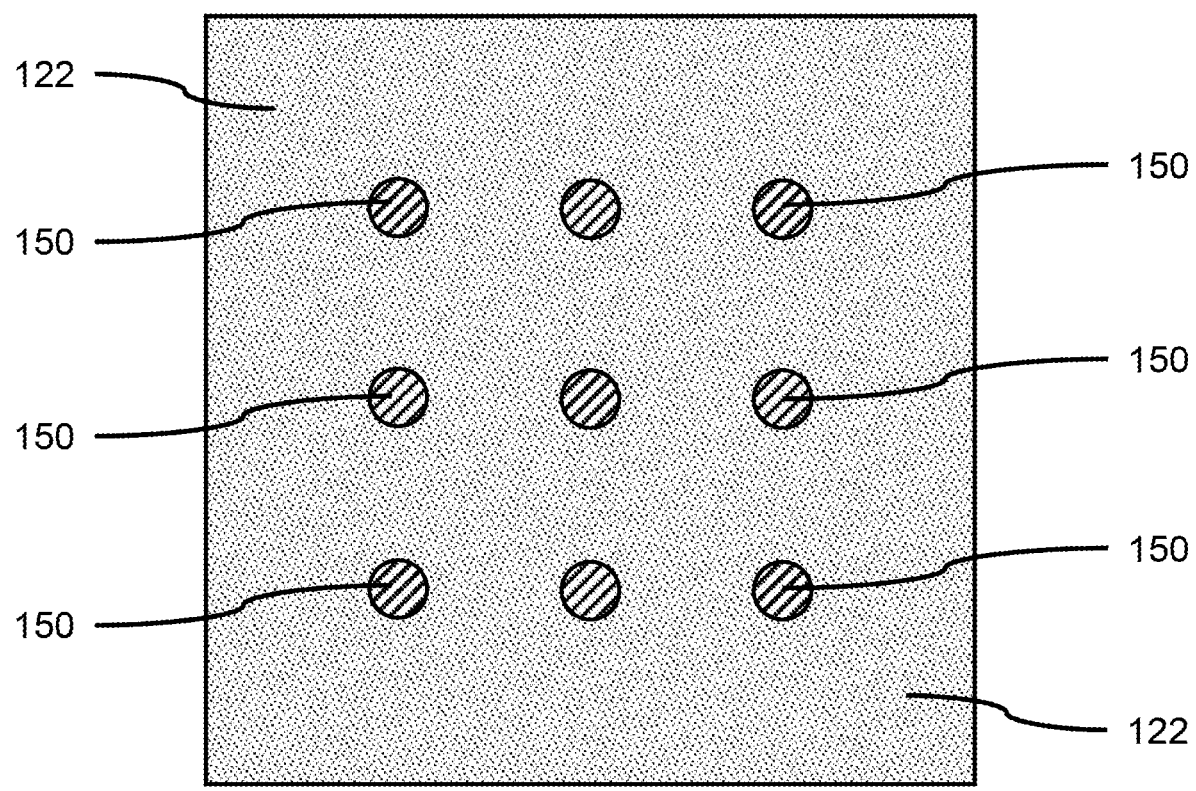
FIG. 5 is a top view showing a 3×3 grid of stack templates on underlying precursor stacks and the remaining lower electrode slab, in accordance with an embodiment of the present invention.

FIG. 5 is a top view showing a 3×3 grid of stack templates on underlying precursor stacks and the remaining lower electrode slab, in accordance with an embodiment of the present invention.

In one or more embodiments, a plurality of precursor stacks 123 can be formed on the substrate 110, where the plurality of precursor stacks 123 can be arranged in a pattern on the substrate, for example, a 3×3 square or rectangular grid pattern, a 5×5 square or rectangular grid pattern, or a 10×10 square or rectangular grid pattern, although other layout patterns are also contemplated. The number of precursor stacks 123 in the pattern can determine the amount of current conducted through the device, and multiple transistor arrays can work together to improve the uniformity of the electron emission and total current of separate devices, and thus the device performance. The remaining lower electrode slab 122 can be exposed between the precursor stacks 123.

Figure 6:
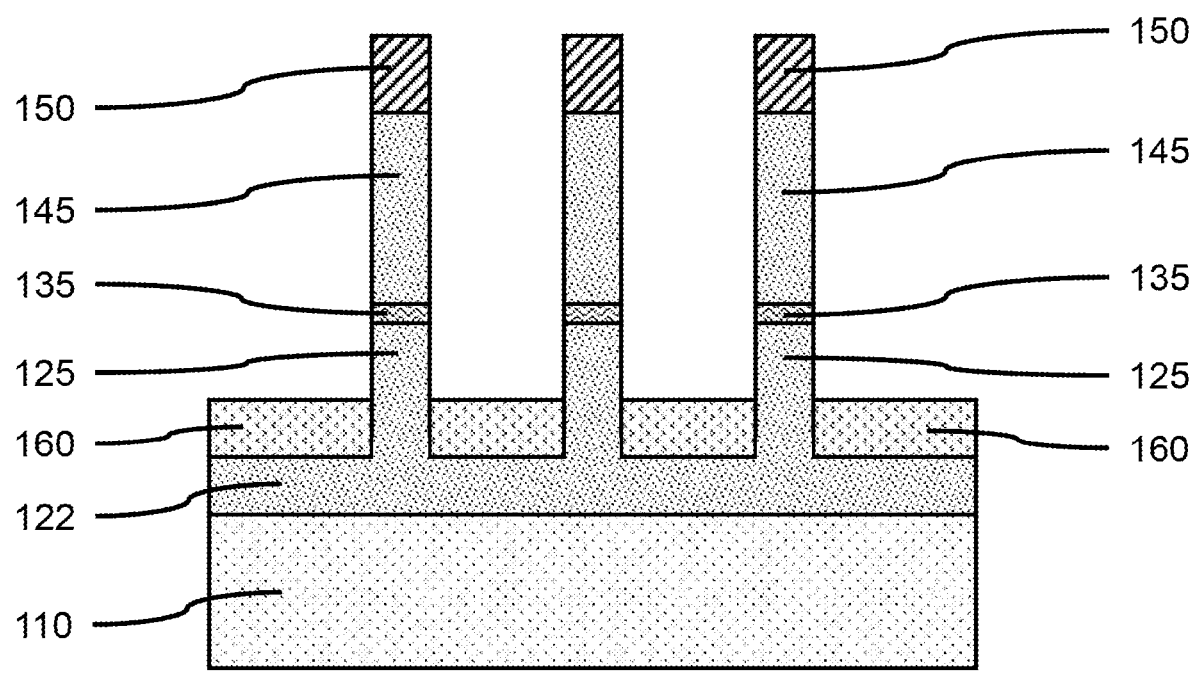
FIG. 6 is a cross-sectional side view showing a bottom spacer layer on the lower electrode slab, in accordance with an embodiment of the present invention.

FIG. 6 is a cross-sectional side view showing a bottom spacer layer on the lower electrode slab, in accordance with an embodiment of the present invention.

In one or more embodiments, a bottom spacer layer 160 can be formed on the exposed surface of the lower electrode slab 122. The bottom spacer layer 160 can be formed by a directional deposition, for example, a gas cluster ion beam deposition (GCIB) or high density plasm deposition (HDP), and/or a blanket deposition with an etch-back using a selective etch, for example, a wet chemical etch.

Figure 7:
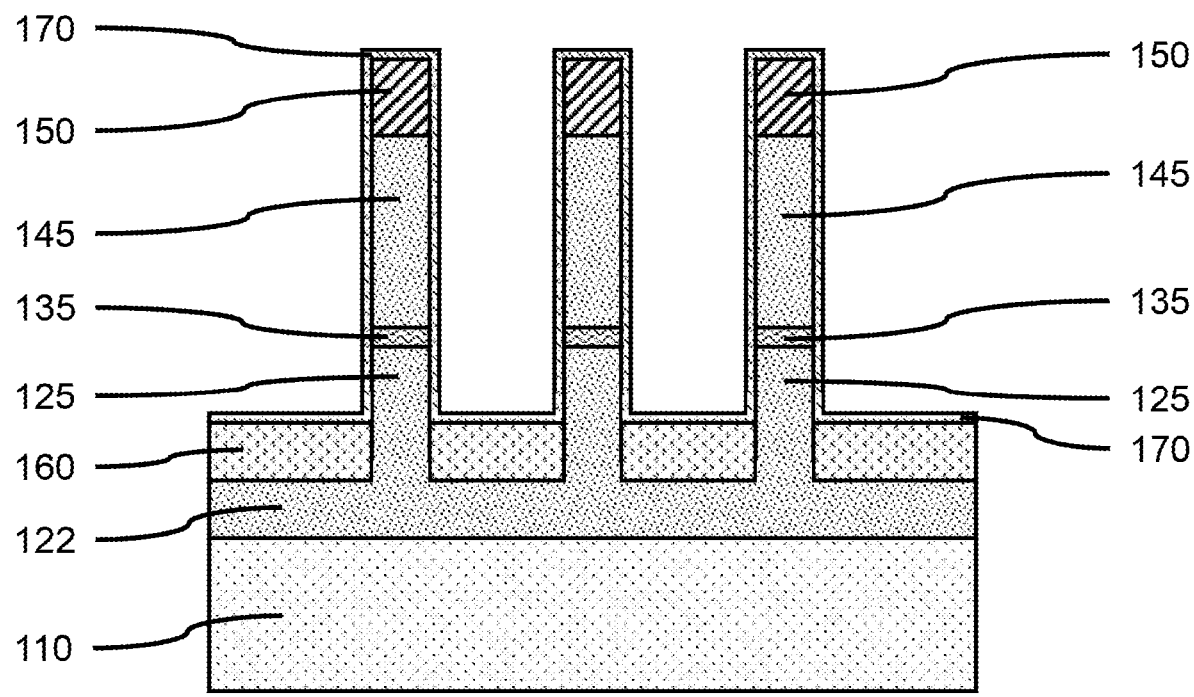
FIG. 7 is a cross-sectional side view showing a liner layer on the bottom spacer layer, stack template, and exposed portion of the precursor stack, in accordance with an embodiment of the present invention.

FIG. 7 is a cross-sectional side view showing a liner layer on the bottom spacer layer, stack template, and exposed portion of the precursor stack, in accordance with an embodiment of the present invention.

In one or more embodiments, a liner layer 170 can be formed on the exposed surfaces of the stack templates 150, upper electrode column 145, graphene plate 135, lower electrode column 125, and lower electrode slab 122, where the liner layer 170 can be formed by a conformal deposition, for example, atomic layer deposition (ALD), plasma enhanced ALD (PEALD), or a combination thereof. The liner layer can be a gate dielectric layer for a gate structure.

In various embodiments, the liner layer 170 can be an electrically insulating dielectric material, including, but not limited to, silicon oxide (SiO), silicon nitride (SiN), a high-k dielectric material, and combinations thereof. The high-k dielectric material can include, but not be limited to, metal oxides, for example, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k dielectric material may further include dopants such as lanthanum, aluminum, magnesium, or combinations thereof.

In various embodiments, the liner layer 170 can have a thickness in a range of about 1 nm to about 3 nm, or about 2 nm, although other thicknesses are also contemplated.

Figure 8:
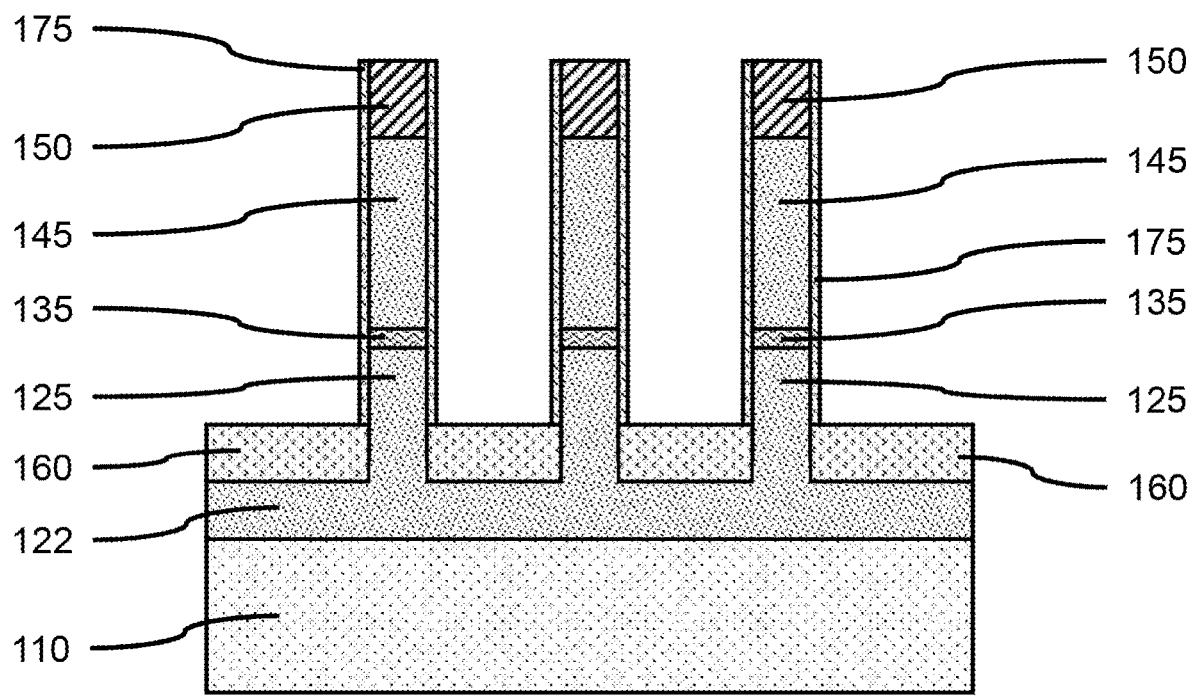
FIG. 8 is a cross-sectional side view showing portions of the liner layer removed from the bottom spacer layer and stack templates to form liner casings on each of the precursor stacks, in accordance with an embodiment of the present invention.

FIG. 8 is a cross-sectional side view showing portions of the liner layer removed from the bottom spacer layer and stack templates to form liner casings on each of the precursor stacks, in accordance with an embodiment of the present invention.

In one or more embodiments, portions of the liner layer 170 can be removed from the bottom spacer layer 160 and stack templates 150 to form liner casings 175 on each of the precursor stacks 123. The portions of the liner layer 170 can be removed using a selective, directional etch (e.g., RIE), while portions of the liner layer 170 remain on the sidewalls of the precursor stacks 123 and stack templates 150. The liner casings 175 can cover only a portion of the sidewall of the lower electrode column 125, where the lower section of the lower electrode column 125 can be covered by the bottom spacer layer 160.

Figure 9:
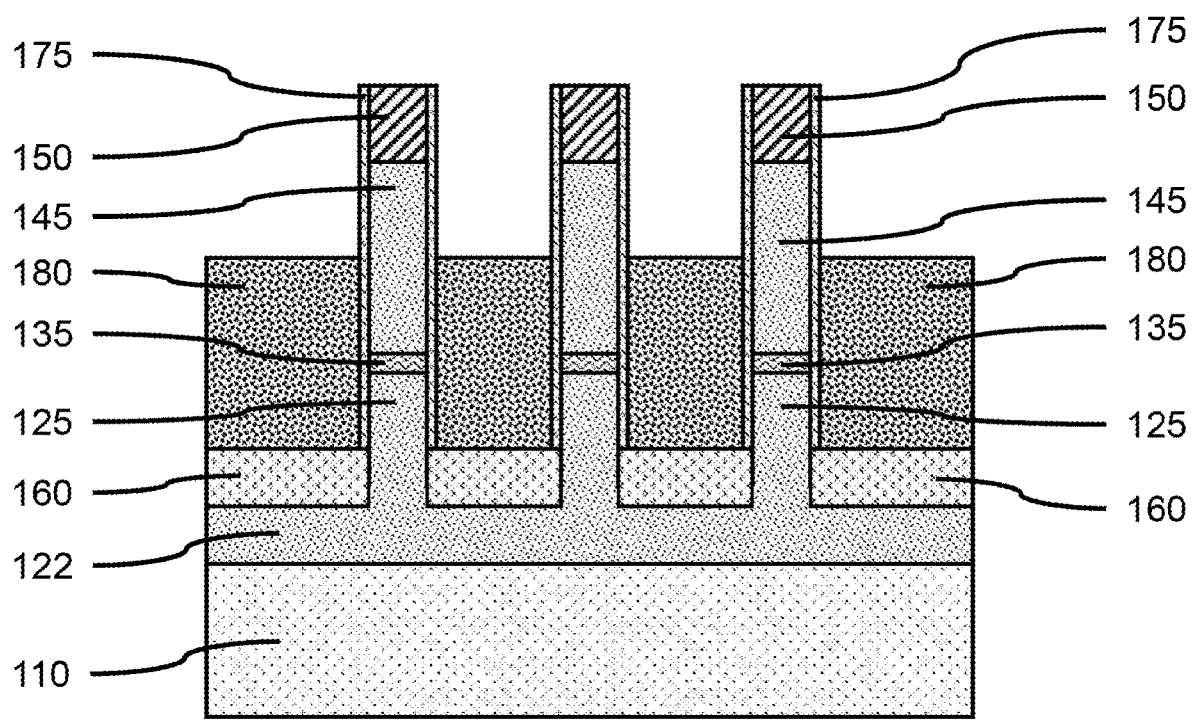
FIG. 9 is a cross-sectional side view showing a conductive gate layer formed on the bottom spacer layer and liner casings, in accordance with an embodiment of the present invention.

FIG. 9 is a cross-sectional side view showing a conductive gate layer formed on the bottom spacer layer and liner casings, in accordance with an embodiment of the present invention.

In one or more embodiments, a conductive gate layer 180 can be formed on the bottom spacer layer 160, where the conductive gate layer 180 can be formed by a blanket deposition and partially etched back to a predetermined height using a selective isotropic etch (e.g., wet chemical etch). A portion of the liner casing 175 on the stack template 150 and upper electrode column 145 can be exposed by removing an upper portion of the conductive gate layer 180. The conductive gate layer 180 can cover the portion of the liner casing 175 on the upper electrode column 145, graphene plate 135, and lower electrode column 125, above the bottom spacer layer 160.

Figure 10:
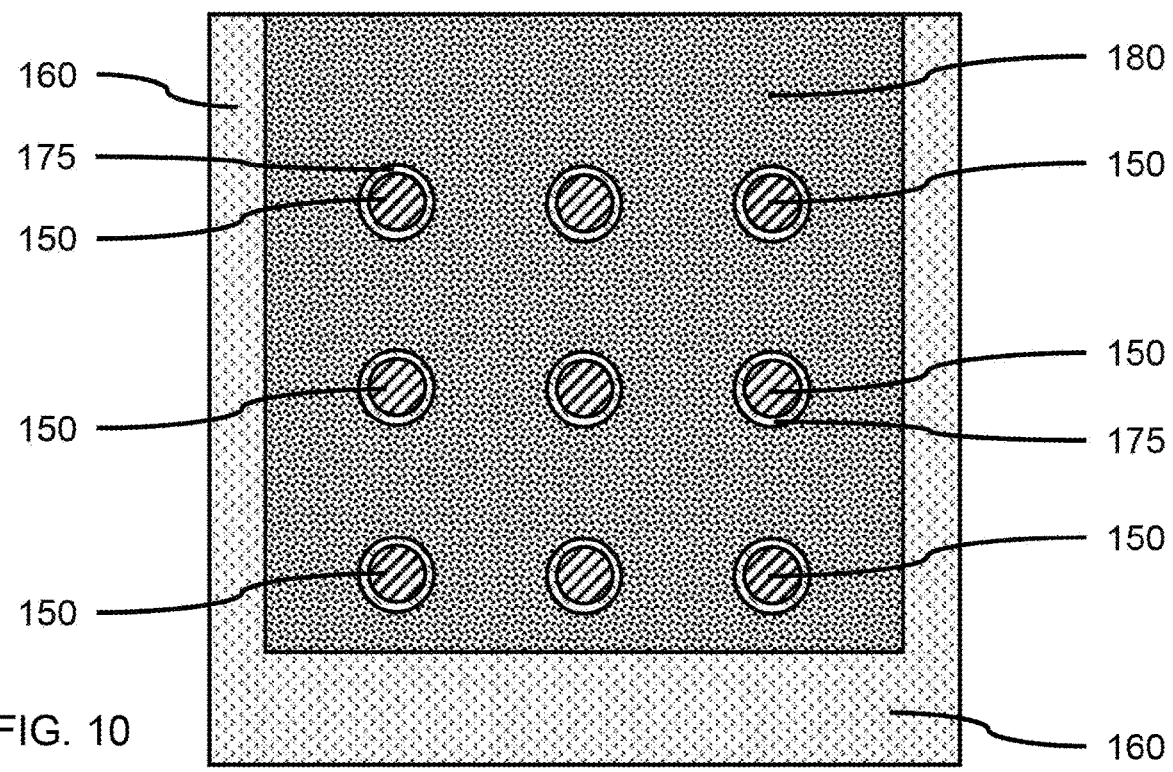
FIG. 10 is a top view showing a 3×3 grid of stack templates on underlying precursor stacks with a liner casing around each of the precursor stacks, and a patterned conductive gate layer around the precursor stacks, in accordance with an embodiment of the present invention.

FIG. 10 is a top view showing a 3×3 grid of stack templates on underlying precursor stacks with a liner casing around each of the precursor stacks, and a patterned conductive gate layer around the precursor stacks, in accordance with an embodiment of the present invention.

In one or more embodiments, the conductive gate layer 180 can be etched to remove portions of the conductive gate layer 180 along the periphery around the plurality of precursor stacks 123 arranged in the pattern on the substrate 110. A lithography mask and etch process can be performed to pattern the conductive gate layer 180. The lateral extension of the conductive gate layer 180 can provide sufficient space for later metal contact formation. The shape of the conductive gate layer 180 does not have to be symmetric (e.g., square).

Figure 11:
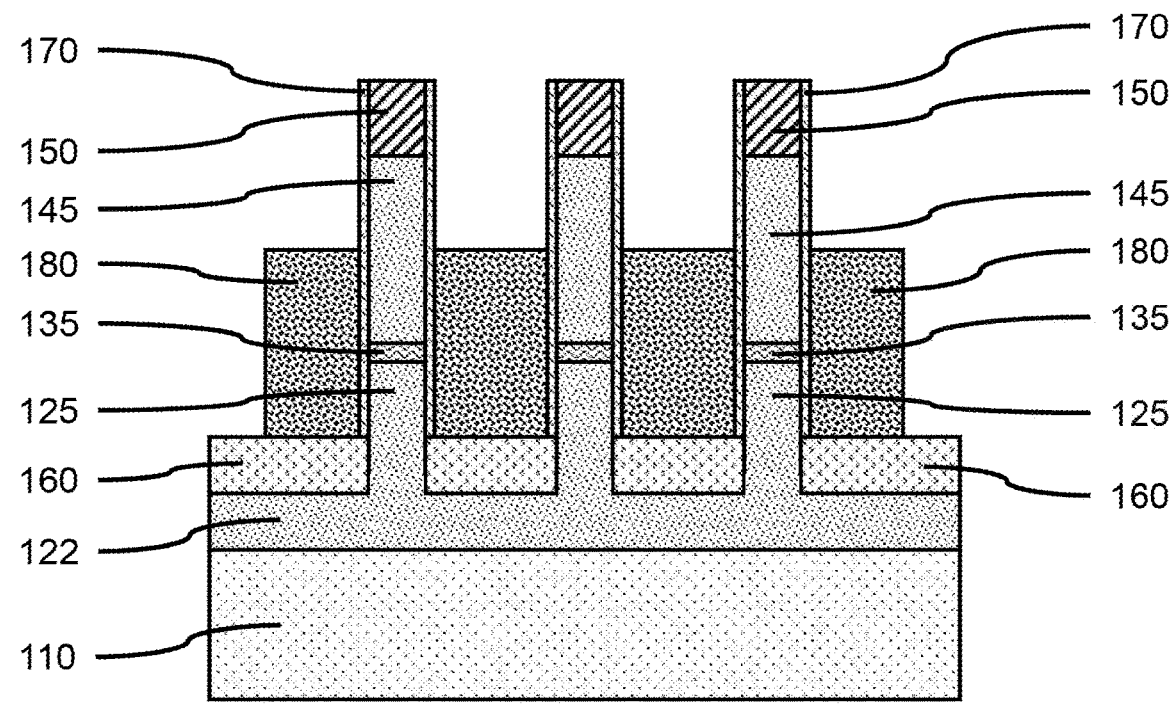
FIG. 11 is a cross-sectional side view showing a patterned conductive gate layer on the bottom spacer layer and liner casings, in accordance with an embodiment of the present invention.

FIG. 11 is a cross-sectional side view showing a patterned conductive gate layer on the bottom spacer layer and liner casings, in accordance with an embodiment of the present invention.

In one or more embodiments, a portion of the bottom spacer layer 160 can be exposed by removal of the portions of the conductive gate layer 180.

Figure 12:
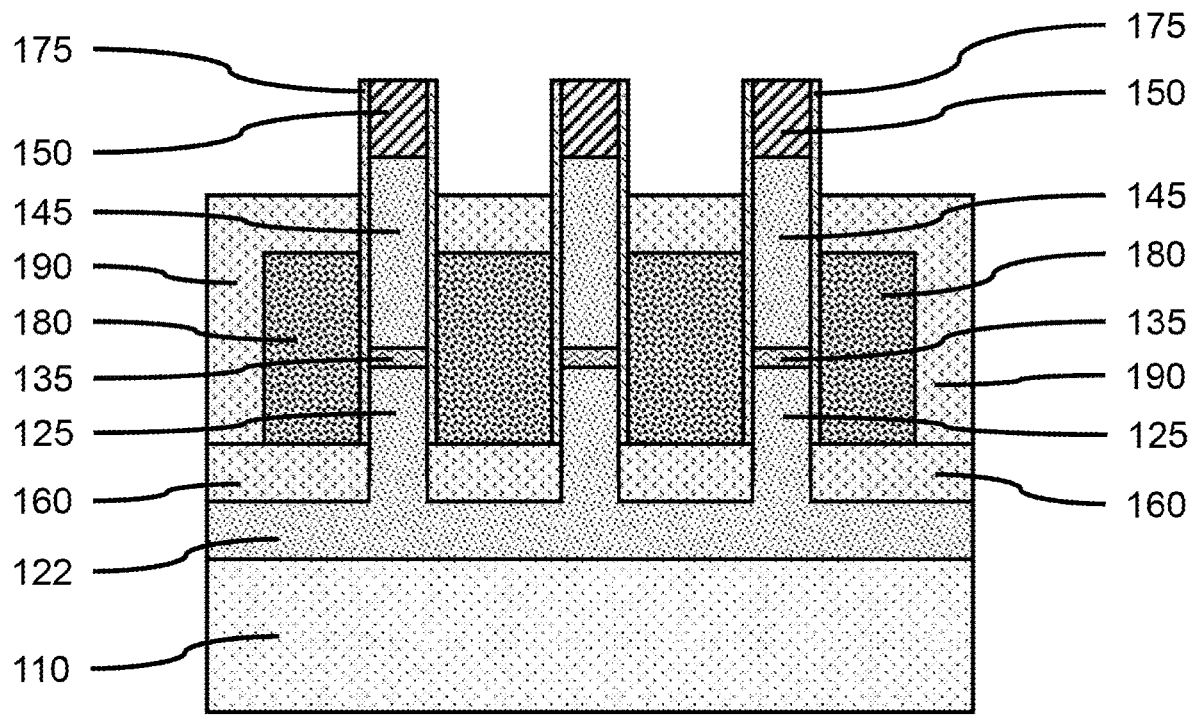
FIG. 12 is a cross-sectional side view showing a fill layer on the patterned conductive gate layer and bottom spacer layer, in accordance with an embodiment of the present invention.

FIG. 12 is a cross-sectional side view showing a fill layer on the patterned conductive gate layer and bottom spacer layer, in accordance with an embodiment of the present invention.

In one or more embodiments, a fill layer 190 can be formed on the patterned conductive gate layer 180 and bottom spacer layer 160, where the fill layer 190 can be formed by a blanket deposition (e.g., CVD, PECVD, spin-on). The fill layer 190 can cover the top surface of the conductive gate layer 180 and a portion of the upper electrode column 145. The top surface of the fill layer can be below the top surface of the upper electrode column 145 and the stack templates 150.

In various embodiments, the fill layer 190 can be an electrically insulating dielectric material, including, but not limited to, silicon oxide (SiO), silicon nitride (SiN), silicon oxynitride (SiON), silicon boro carbonitride (SiBCN), low-k dielectric materials, and combinations thereof. The low-k dielectric materials can be carbon-doped silicon oxide (SiO:C), fluorine doped silicon oxide (SiO:F), silicon based polymeric dielectric materials, for example, hydrogen silsesquioxane (HSQ) and methylsilsesquioxane (MSQ), tetraethoxysilane (TEOS), and combinations thereof.

Figure 13:
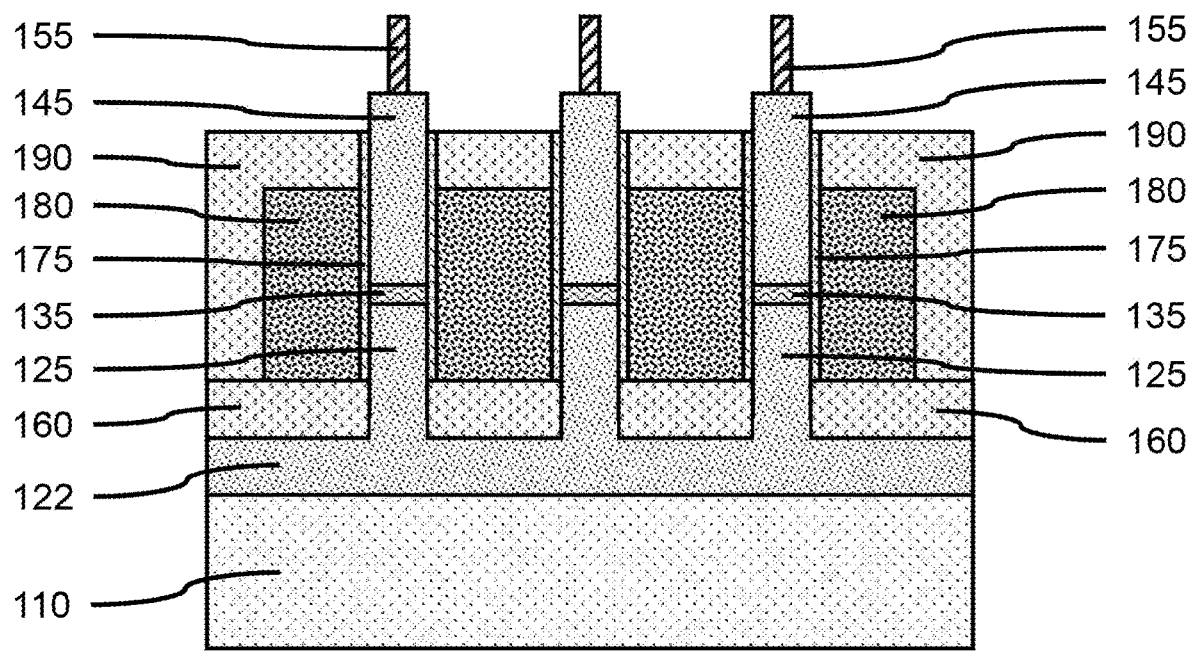
FIG. 13 is a cross-sectional side view showing the stack templates thinned to form template posts on the upper electrode columns, in accordance with an embodiment of the present invention.

FIG. 13 is a cross-sectional side view showing the stack templates thinned to form template posts on the upper electrode columns, in accordance with an embodiment of the present invention.

In one or more embodiments, the portion of the liner casings 175 extending above the top surface of the fill layer 190 can be removed, where the liner casings 175 can be removed using a selective, isotropic etch (e.g., wet chemical etch, dry plasma etch). Removal of the portion of the liner casings 175 can expose the sidewalls of the stack templates 150 and the upper electrode column 145.

In one or more embodiments, outer portions of the stack templates 150 can be removed using a selective isotropic etch to form template posts 155 on the upper electrode columns 145. The template posts 155 can have a diameter in a range of about 10 nm to about 30 nm, or about 10 nm to about 20 nm, or about 10 nm to about 15 nm, although other diameters and sizes are also contemplated.

Figure 14:
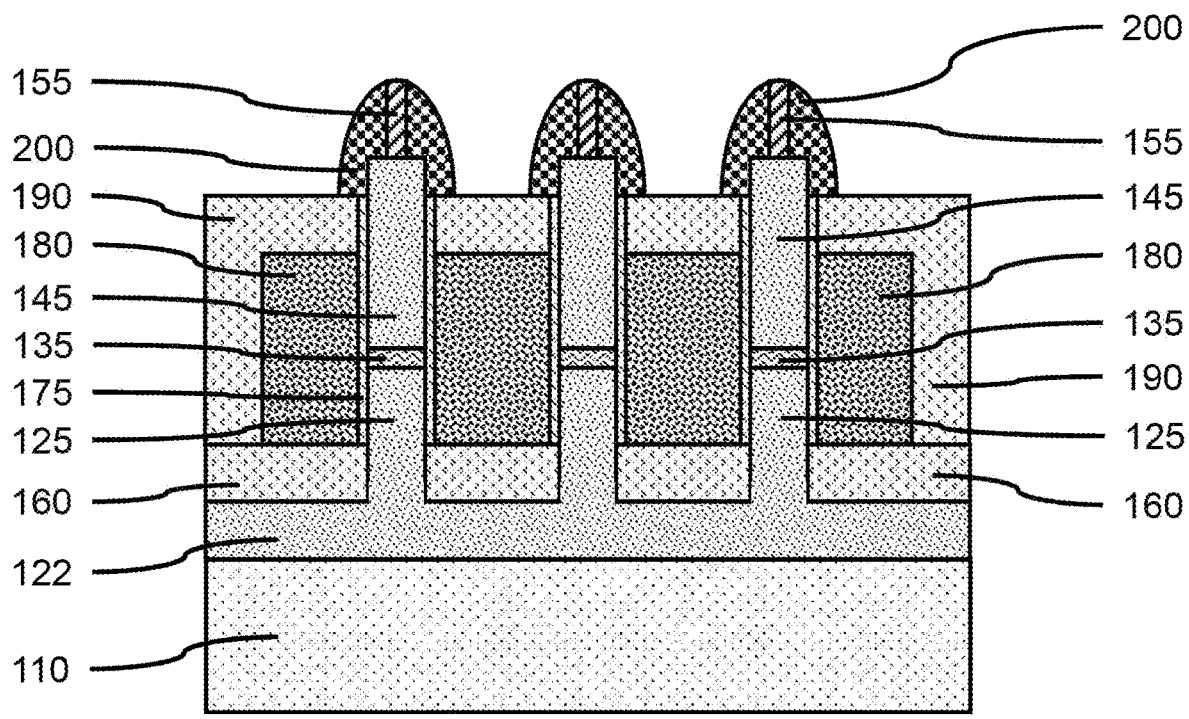
FIG. 14 is a cross-sectional side view showing a stack cap on each of the template posts, upper electrode columns, fill layer, and liner casings, in accordance with an embodiment of the present invention.

FIG. 14 is a cross-sectional side view showing a stack cap on each of the template posts, upper electrode columns, fill layer, and liner casings, in accordance with an embodiment of the present invention.

In one or more embodiments, a stack cap 200 can be formed on each of the template posts 155, upper electrode columns 145, liner casings 175, and fill layer 190. The stack cap 200 can be formed by a deposition process (e.g., physical vapor deposition (PVD), chemical vapor deposition (CVD), plasma enhanced chemical vapor deposition (PECVD), inductively coupled plasma chemical vapor deposition (ICP CVD), plating, thermal or e-beam evaporation, or sputtering or a combination thereof.), and a selective directional etch back process (e.g., RIE). The stack cap formation process can provide a rounded surface similar to a sidewall spacer formation process.

In various embodiments, the stack cap 200 can be a metal, including, but not limited to, aluminum (Al), platinum (Pt), gold (Au), tungsten (W), titanium (Ti), or combinations thereof; a conducting metallic compound material, for example, tantalum nitride (TaN), titanium nitride (TiN), tungsten silicide, tungsten nitride (WN), tungsten silicide (WSi), ruthenium oxide (RuO), cobalt silicide (CoSi), nickel silicide (NiSi), conductive carbon, or any suitable combination of these materials, and combinations of a metal and conducting metallic compound.

Figure 15:
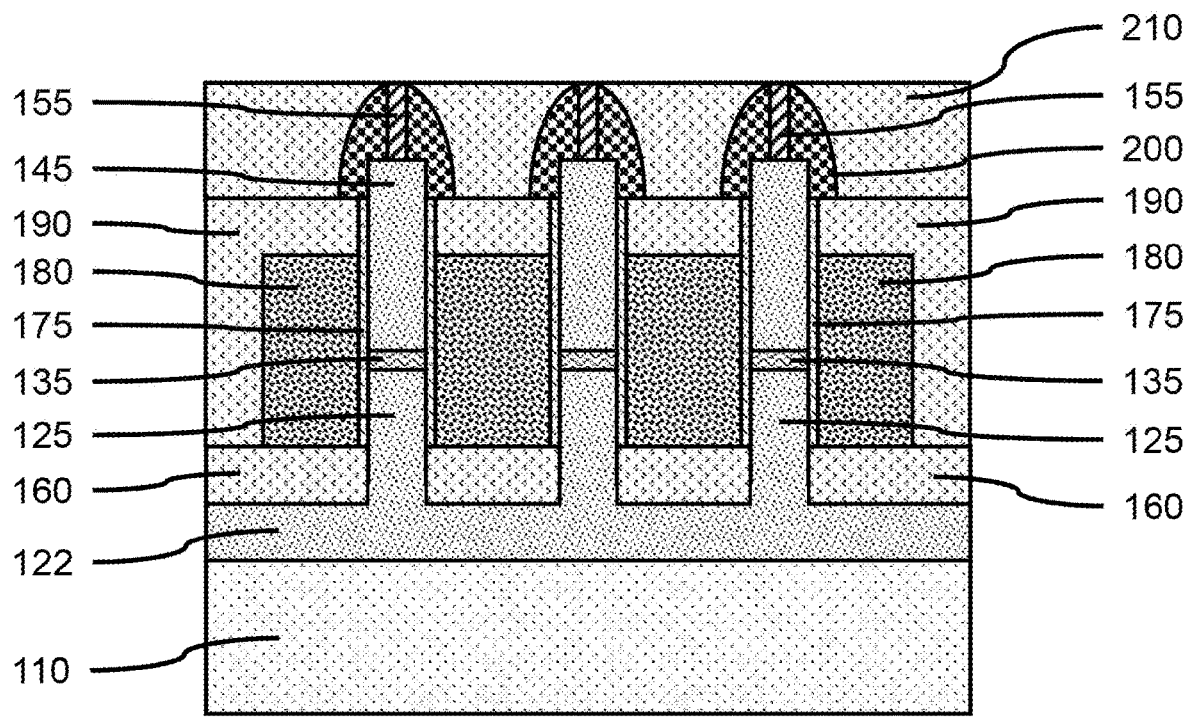
FIG. 15 is a cross-sectional side view showing an interlayer dielectric (ILD) layer on the stack caps and fill layer, in accordance with an embodiment of the present invention.

FIG. 15 is a cross-sectional side view showing an interlayer dielectric (ILD) layer on the stack caps and fill layer, in accordance with an embodiment of the present invention.

In one or more embodiments, an interlayer dielectric (ILD) layer 210 can be formed on the stack caps 200 and fill layer 190, where the ILD layer 210 can be formed by a blanket deposition (e.g., CVD, PECVD, spin-on). The ILD layer 210 can cover the stack caps 200 and top surfaces of the template posts 155, and be planarized using chemical mechanical planarization (CMP) to expose the top surfaces of the template posts 155.

Figure 16:
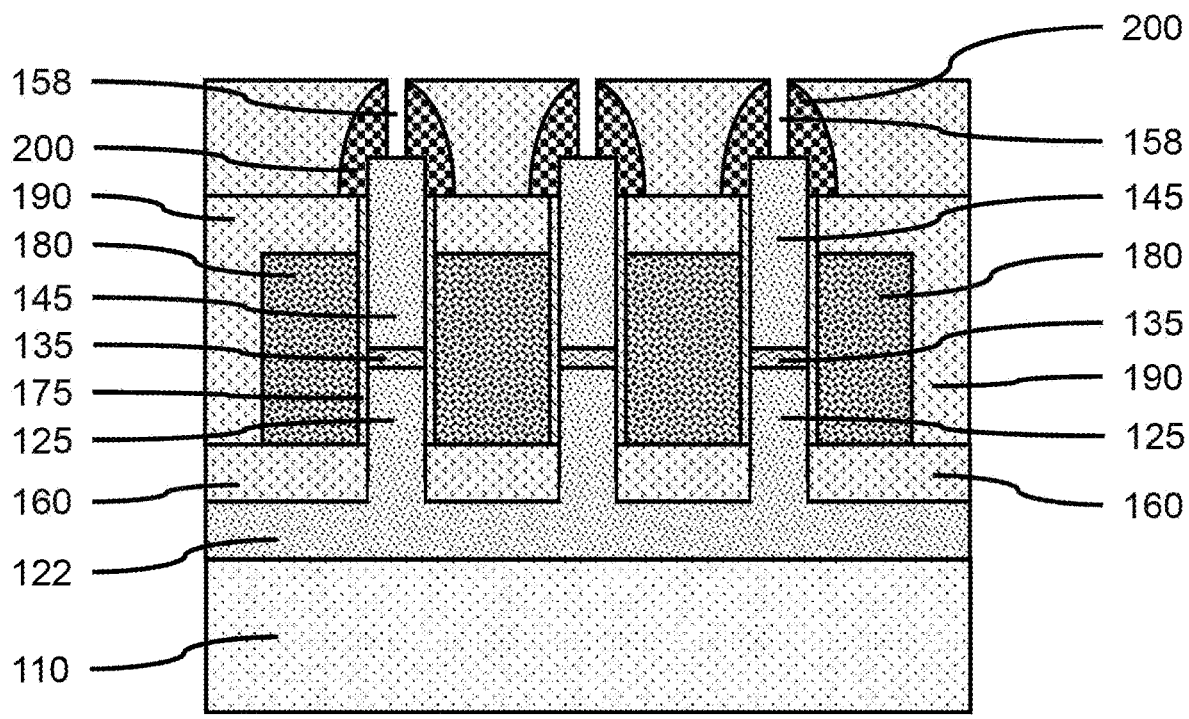
FIG. 16 is a cross-sectional side view showing the template posts removed from within the stack caps to form cavities exposing a portion of the upper electrode columns, in accordance with an embodiment of the present invention.

FIG. 16 is a cross-sectional side view showing the template posts removed from within the stack caps to form cavities exposing a portion of the upper electrode columns, in accordance with an embodiment of the present invention.

In one or more embodiments, the template posts 155 can be removed from within the stack caps 200 to form cavities 158 that expose a portion of the upper electrode columns 145. The template posts 155 can be removed using a selective, isotropic etch.

Figure 17:
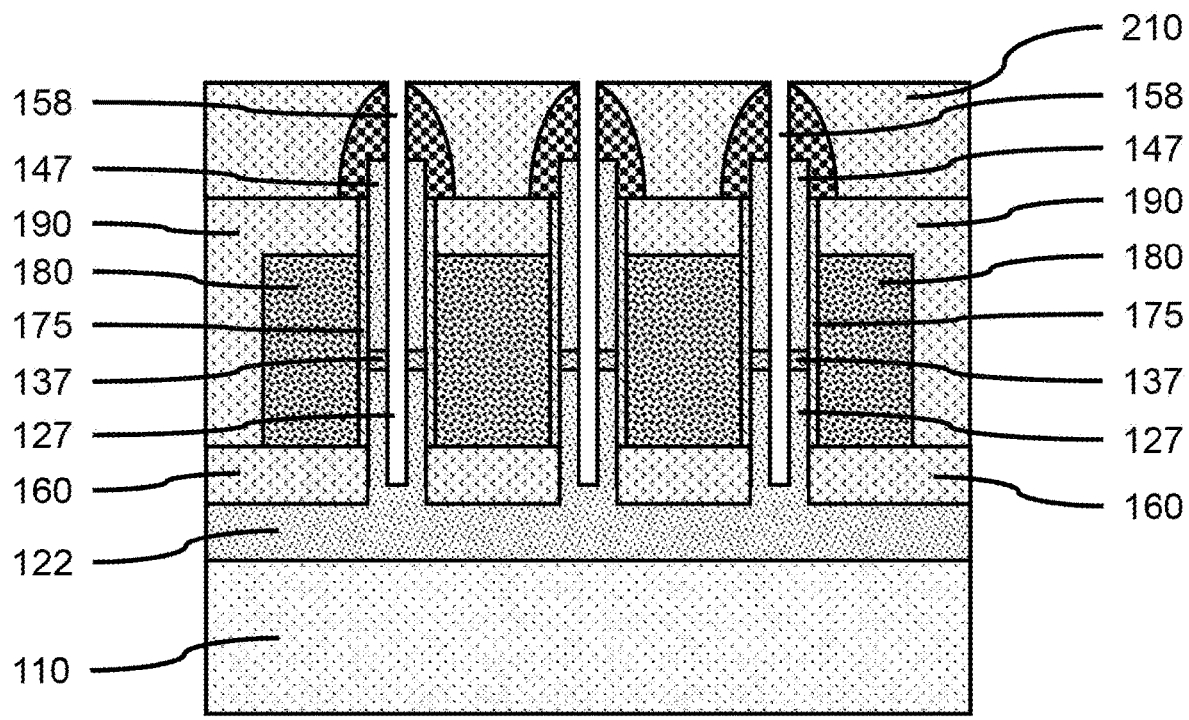
FIG. 17 is a cross-sectional side view showing the cavities extended through the upper electrode columns, graphene plates, and into the lower electrode column, in accordance with an embodiment of the present invention.

FIG. 17 is a cross-sectional side view showing the cavities extended through the upper electrode columns, graphene plates, and into the lower electrode column, in accordance with an embodiment of the present invention.

In one or more embodiments, the cavities 158 can be extended through the upper electrode columns 145, graphene plates 135, and into the lower electrode column 125, using a sequence of selective directional etches (e.g., RIE). The cavity can convert the previously solid upper electrode columns 145, graphene plates 135, and lower electrode column 125 into an upper electrode annulus 147, graphene ring 137, and lower electrode annulus 127. In various embodiments, the cavities 158 do not extend into the region of the lower electrode slab 122, so a section of the lower electrode column 125 can remain solid. If over-etching occurs and the cavities extend to the substrate 110, the lower electrode slab 122 can still be electrically connected to each lower electrode annulus 127 as one bottom electrode.

Figure 18:
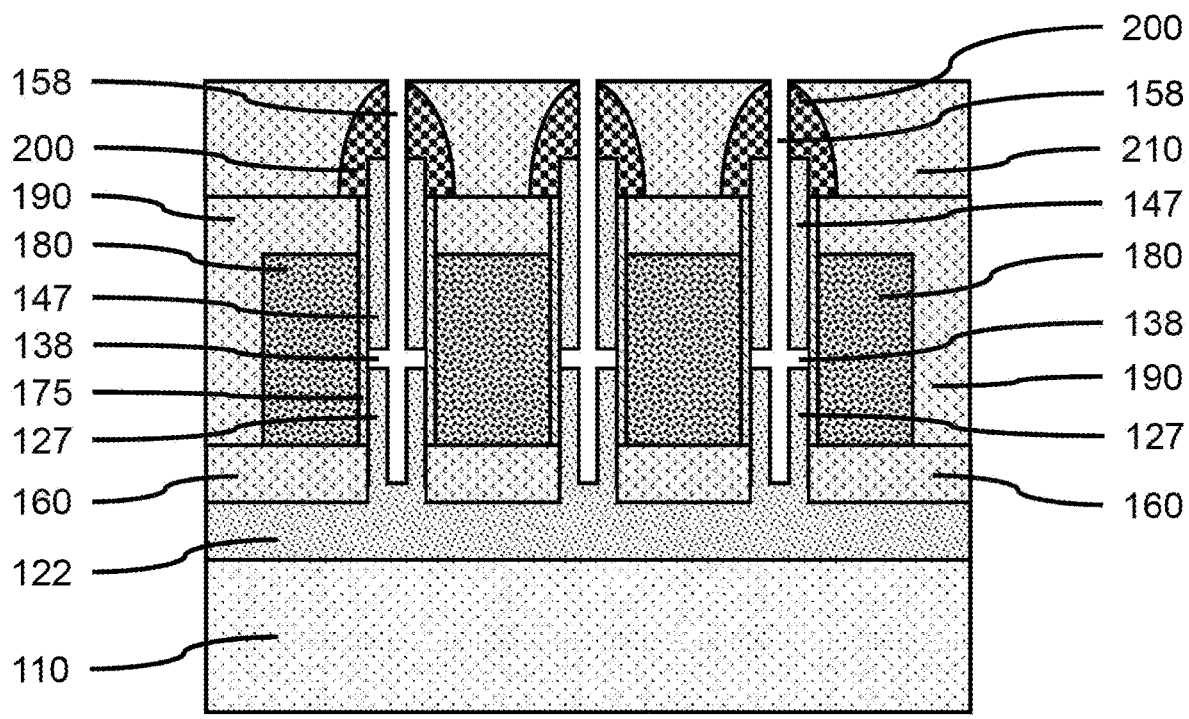
FIG. 18 is a cross-sectional side view showing the graphene plates removed to form an interstice between the upper electrode column and the lower electrode column, in accordance with an embodiment of the present invention.

FIG. 18 is a cross-sectional side view showing the graphene plates removed to form an interstice between the upper electrode column and the lower electrode column, in accordance with an embodiment of the present invention.

In one or more embodiments, the graphene rings 137, remaining after forming a hole created by the cavity 150 through the graphene plates 135, can be removed, where the graphene rings 137 can be selectively removed using an oxygen plasma. Removing the graphene ring 137 can form an interstice 138 between the upper electrode annulus 147 and the lower electrode annulus 127. The removal of the graphene ring 137 can leave the upper electrode annulus 147 separated from the lower electrode annulus 127 by a uniform distance around the circumference of the two annuli, as determined by the number of atomic layers forming the graphene layer 130. The graphene atomic layers (i.e., monolayers) can have a thickness of approximately 0.345 nm each.

In various embodiments, the face of the upper electrode annulus 147 can be separated from the face of the lower electrode annulus 127 by a distance in a range of about 1 nm to about 2.8 nm, or about 1.4 nm to about 2.1 nm, although other distances are also contemplated.

In various embodiments, the face of the upper electrode annulus 147 and the lower electrode annulus 127 at the interstice 138 can each have a surface area in a range of about 80 $nm^2$ to about 5000 $nm^2$, or about 200 $nm^2$ to about 2000 $nm^2$, or about 300 $nm^2$ to about 500 $nm^2$, although other surface areas are also contemplated. The area of the interstice 138 can depend upon the inner diameter and outer diameter of the upper electrode annulus 147 and the lower electrode annulus 127.

Figure 19:
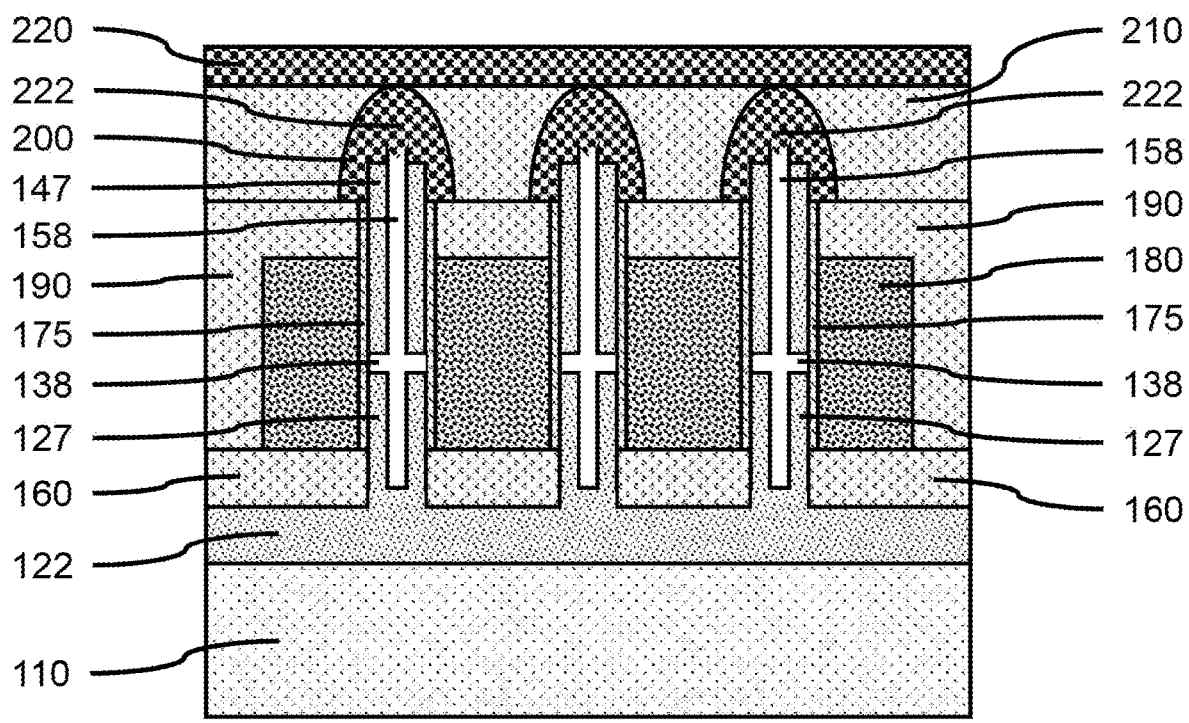
FIG. 19 is a cross-sectional side view showing a top conductive sheet on the ILD layer and the stack caps, in accordance with an embodiment of the present invention.

FIG. 19 is a cross-sectional side view showing a top conductive sheet on the ILD layer and the stack caps, in accordance with an embodiment of the present invention.

In one or more embodiments, a top conductive sheet 220 can be formed on the ILD layer 210 and the stack caps 200, where a portion of the material forming the top conductive sheet 220 can fill in the cavity 158 in the stack caps 200 to form a conductive plug 222 at the top of the cavity 158. In various embodiments, the top conductive sheet 220 can be patterned to expose portions of the underlying layers to allow access for electrical contacts.

In various embodiments, the top conductive sheet 220 can be a metal, including, but not limited to, aluminum (Al), platinum (Pt), gold (Au), tungsten (W), titanium (Ti), or a combination thereof.

The wrap-around gate structure formed by the conductive gate layer 180 and liner casings 175 can control the electric field at the facing edges of the upper electrode annulus 147 and lower electrode annulus 127 separated by the interstice 138. The gate structure can be used to control whether there will be tunneling current between the upper electrode annulus 147 and lower electrode annulus 127 across the interstice 138.

Figure 20:
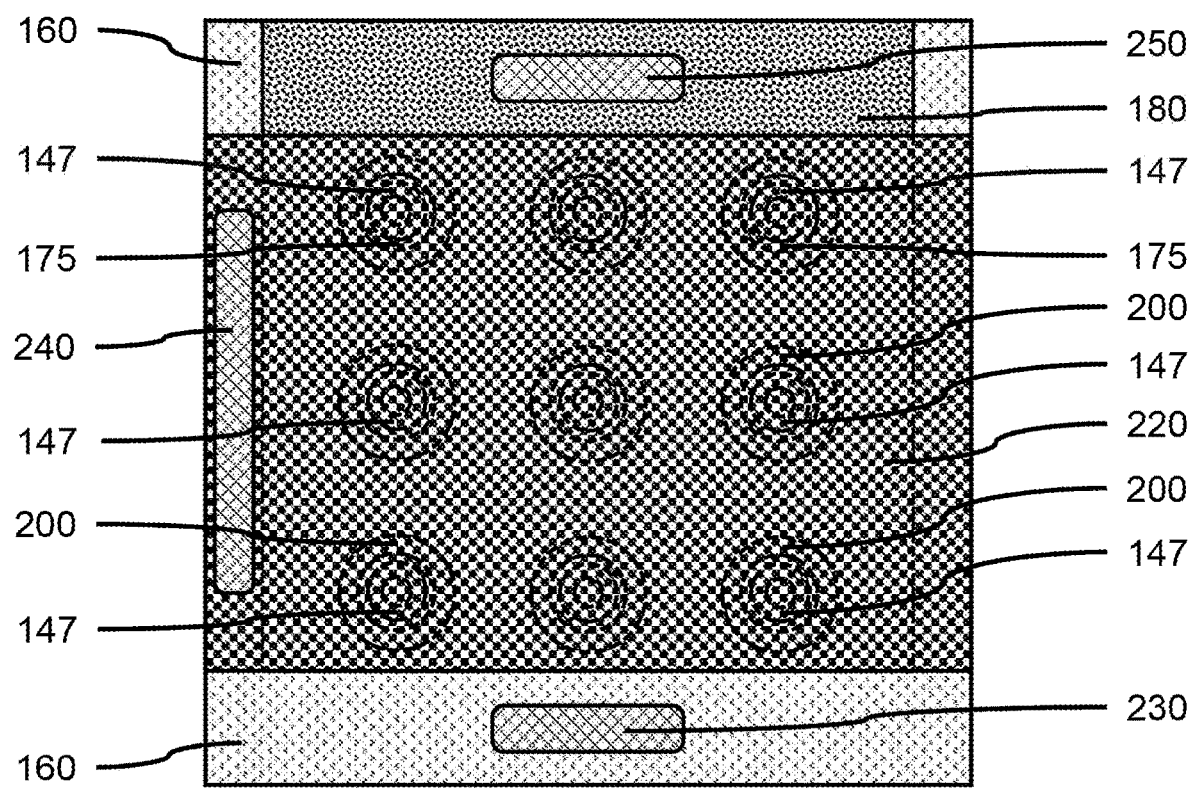
FIG. 20 is a top view showing a 3×3 grid of stack caps on the upper electrode columns with a liner casing around the upper electrode column, a patterned top conductive sheet on the stack caps, and electrical contacts, in accordance with an embodiment of the present invention.

FIG. 20 is a top view showing a 3×3 grid of stack caps on the upper electrode columns with a liner casing around the upper electrode column, a patterned top conductive sheet on the stack caps, and electrical contacts, in accordance with an embodiment of the present invention.

In one or more embodiments, a trench can be formed in the layers down to the conductive gate layer 180 and lower electrode slab 122, and electrical contacts can be formed to the top conductive sheet 220, conductive gate layer 180 and lower electrode slab 122.

In various embodiments, the top contact 240, gate contact 250, and bottom electrode contact 230 can be a metal, including, but not limited to, aluminum (Al), platinum (Pt), gold (Au), tungsten (W), titanium (Ti), or any combination thereof.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps operations, elements, components and/or groups thereof.

Spatially relative terms, such as "beneath," "bellow", "above," "upper," and the like, can be used herein for ease of description to describe one elements or feature's relationship to another element(s) or feature(s) as illustrated in the FIGS. It will be understood that the spatially relative terms are intended to encompass different orientations of the device operation in addition to the orientation depicted FIGS. For example, if the device in the FIGS. is turned over elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it ill also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical metal-air transistor device, comprising:
    forming a precursor stack with a stack template on the precursor stack on a substrate;
    forming a bottom spacer on the substrate around the precursor stack;
    depositing a liner casing on the precursor stack;
    depositing a conductive gate layer on the bottom spacer and liner casing;
    reducing the size of the stack template to form a template post on the precursor stack; and
    forming a stack cap on the template post and precursor stack.

2. The method of claim 1, further comprising forming an interlayer dielectric (ILD) layer on the stack cap.

3. The method of claim 2, further comprising removing the template post to form a cavity in the stack cap that exposes a portion of a top surface of the precursor stack.

4. The method of claim 3, wherein the precursor stack includes an upper electrode column, a lower electrode column, and a graphene plate between the upper electrode column and lower electrode column.

5. The method of claim 4, further comprising extending the cavity through the upper electrode column, graphene plate, and lower electrode column to form an upper electrode annulus, graphene ring, and lower electrode annulus.

6. The method of claim 5, further comprising removing the graphene ring to form an interstice between the upper electrode annulus and lower electrode annulus.

7. The method of claim 5, wherein the graphene plate has a thickness of 3 monolayers to 8 monolayers.

8. The method of claim 7, wherein the graphene plate has a thickness of 4 monolayers to 6 monolayers.

9. The method of claim 8, wherein the upper electrode annulus and lower electrode annulus are each a metal selected from the group consisting of tungsten (W), cobalt (Co), tantalum (Ta), niobium (Nb), platinum (Pt), ruthenium (Ru), palladium (Pd), gold (Au), and combinations thereof.

10. A method of forming a vertical metal-air transistor device, comprising:
    forming a lower electrode layer on a substrate;
    forming a graphene layer on the lower electrode layer;
    forming an upper electrode layer on the graphene layer;
    forming a stack template on the upper electrode layer;
    removing portions of the upper electrode layer, graphene layer, and lower electrode layer to form a precursor stack on a lower electrode slab, wherein the precursor stack includes an upper electrode column, a lower electrode column on the lower electrode slab, and a graphene plate between the upper electrode column and lower electrode column;
    forming a bottom spacer on the lower electrode slab around the precursor stack;
    depositing a liner casing on the precursor stack and bottom spacer;
    depositing a conductive gate layer on the liner casing;

removing a portion of the liner casing on the stack template;

reducing the size of the stack template to form a template post on the precursor stack; and forming a stack cap on the template post and precursor stack.

11. The method of claim 10, further comprising removing the template post to form a cavity in the stack cap that exposes a portion of a top surface of the upper electrode column.

12. The method of claim 11, further comprising extending the cavity through the upper electrode column, graphene plate, and lower electrode column to form an upper electrode annulus, graphene ring, and lower electrode annulus.

13. The method of claim 12, further comprising removing the graphene ring to form an interstice between the upper electrode annulus and lower electrode annulus.

14. The method of claim 13, wherein the interstice has a surface area in a range of about 80 nm$^2$ to about 5000 nm$^2$.

* * * * *